United States Patent
Nishizawa

(10) Patent No.: US 6,217,377 B1
(45) Date of Patent: Apr. 17, 2001

(54) ELECTRIC CIRCUIT CONNECTION CONTAINER

(75) Inventor: Hiroshi Nishizawa, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 0 days.

(21) Appl. No.: 09/467,143

(22) Filed: Dec. 20, 1999

Related U.S. Application Data

(63) Continuation of application No. 08/987,604, filed on Dec. 9, 1997, now abandoned.

(30) Foreign Application Priority Data

Dec. 9, 1996 (JP) .................................................. 8-327423

(51) Int. Cl.[7] .................................................. H01R 13/73
(52) U.S. Cl. .......................................................... 439/553
(58) Field of Search ................... 439/76.1, 76.2, 439/555, 557; 361/736

(56) References Cited

U.S. PATENT DOCUMENTS

| | | | |
|---|---|---|---|
| 3,585,563 | 6/1971 | Hegle | 338/180 |
| 4,528,616 | 7/1985 | Koppensteiner | 361/399 |
| 4,685,753 | 8/1987 | Isshiki et al. | 439/74 |
| 4,752,254 | 6/1988 | Inoue et al. | 439/834 |
| 4,850,884 | 7/1989 | Sawai et al. | 439/76.2 |
| 5,107,404 | 4/1992 | Tam | 361/736 |
| 5,111,362 | 5/1992 | Flamm et al. | 361/736 |
| 5,144,533 | 9/1992 | Annett | 361/740 |
| 5,329,422 | 7/1994 | Sasaki | 361/686 |
| 5,446,622 | 8/1995 | Landry et al. | 361/737 |
| 5,475,566 | 12/1995 | Rada et al. | 361/736 |

FOREIGN PATENT DOCUMENTS

| | | |
|---|---|---|
| 62-181610 | 8/1987 | (JP) . |
| 1-25284 | 5/1989 | (JP) . |

*Primary Examiner*—Neil Abrams
(74) *Attorney, Agent, or Firm*—Arent Fox Kintner Plotkin & Kahn PLLC

(57) ABSTRACT

An electric circuit connection container for accommodating a printed circuit board in a space formed by an upper case and a lower case and, at the same time, holding and affixing the printed circuit board by a holding and affixing member projected from an inner surface of the upper case. The holding and affixing member is provided with a receiving rib for engagement with an upper surface of the printed circuit board and a lock pieces or latches (12) for locking engagement with a lower surface of the printed circuit board. The lock pieces (12) are pressed into locking position by a busbar assembly (2, 3, 4) upon assembly of the lower case (2) to the upper case (1).

10 Claims, 3 Drawing Sheets

FIG. I

ELECTRIC CIRCUIT CONNECTION CONTAINER

CROSS REFERENCE TO RELATED APPLICATION

This application is a continuation of U.S. patent application Ser. No. 08/987,604, filed Dec. 9, 1997, now abandoned.

BACKGROUND OF THE INVENTION

1. Field of the Invention

The present invention relates to an electric circuit connection container used for electric wiring etc. in automobiles and other vehicles and a method of assembly of the same, more particularly relates to an electric circuit connection container capable of effectively accommodating electric parts etc. projected from a printed circuit board and a method of assembly of same.

2. Description of the Related Art

An electric circuit connection container used for electric wiring etc. in a vehicle is known from Japanese Unexamined Patent Publication (Kokai) No. 62-18160, Japanese Examined Patent Publication (Kokokū) No. 1-25284, etc.

Japanese Unexamined Patent Publication (Kokai) No. 62-18160 discloses an improvement of a joint box (electric circuit connection container) accommodating a printed circuit board containing electronic circuits for used for connection of the wire harnesses of automobiles. This electric circuit connection container uses busbars to centrally perform all of the branch connections required for a wire harness. Recently, however, electric circuit connection containers have not only been able to serve as mere means of connection, but also have been able to perform signal processing inside when printed circuit boards containing electronic circuits are accommodated and electrically connected inside those electric circuit connection containers. The electric circuit connection container disclosed in Japanese Unexamined Patent Publication (Kokai) No. 62-181610 is structured with a housing comprised of an upper case and a lower case. When assembling the electric circuit connection container, the busbars are accommodated in the lower case, a printed circuit board carrying electronic components is laid inside the lower case, the soldering portions (connection terminals) of the printed circuit board and the busbars positioned beneath them are connected by soldering, then the upper case is covered over the printed circuit board. The upper case is structured to have a sufficient height to be able to accommodate electronic components of certain heights carried on the printed circuit board. When assembly such an electric circuit connection container, however, while electronic components of certain heights can be freely positioned, careful attention must be paid not to damage the electronic components carried on the printed circuit board. Therefore, the work efficiency is low. In addition, such an electric circuit connection container is not designed to accommodate several layers of printed circuit boards and therefore is insufficient as an electric circuit connection container used at present in which complicated electrical connection is demanded.

Japanese Examined Patent Publication (Kokoku) No. 1-25284 discloses an electric circuit connection container comprised of an assembly of a circuit board having a group of branched conductive paths formed by busbar wiring and a printed circuit board to be connected to the circuit board. This electric circuit connection container is used by placing a case over the circuit board and putting a cover on the printed circuit board. However, in a structure where a case is placed over a circuit board and a cover is put on the printed circuit board as described above, two parts, that is, the case and the cover, become necessary, so part management is troublesome. Also, the price of the electric circuit connection container becomes high. Further, the assembly of the electric circuit connection container is not easy.

SUMMARY OF THE INVENTION

An object of the present invention is to provide an electric circuit connection container having a low price and a simple structure.

Another object of the present invention is to provide an electric circuit connection container able to accommodate several layers of printed circuit boards.

Still another object of the present invention is to provide a method of assembly of an electric circuit connection container enabling easy assembly with a high reliability.

According to the present invention, there provided an electric circuit connection container provided with a first case; a second case which faces the first case to define a space with the first case in which space a printed circuit board is accommodated; and a holding and affixing member having a part projected from an inner surface of the first case and engaging with the printed circuit board so as to affix the engaged printed circuit board.

Preferably, the holding and affixing member is provided with a receiving rib for engaging with an upper surface of the printed circuit board and a lock piece for engaging with a lower surface of the printed circuit board.

Preferably, the receiving rib is integrally formed with the first case.

Preferably, the lock piece is integrally constituted with the first case.

Preferably, the holding and affixing member having the receiving rib and the lock piece is integrally formed with the first case.

Preferably, the first case is formed by an insulating plastic.

Preferably, a busbar and an insulation plate are arranged between the first case and the second case in addition to the printed circuit board.

Preferably, a connector for connection with an external portion is provided on an outer surface of the first case.

Preferably, the first case is an upper case, and the second case is a lower case.

Further, according to the present invention, there is provided a method for assembling an electric circuit connection container having a first case, a second case which faces the first case to define a space with the first case in which space a printed circuit board is accommodated, and a holding and affixing member provided with a receiving rib to be engaged with an upper surface of the printed circuit board and a lock piece to be engaged with the lower surface of the printed circuit board by affixing the printed circuit board to the electric circuit connection container, comprising the steps of pushing open the lock piece and making the printed circuit board abut against the front end of the receiving rib; returning the lock piece to its original state to affix the printed circuit board by the lock piece; and pressing against the first case and the second case to finally affix the printed circuit board.

The electric circuit connection container of the present invention is characterized in that, as described above, a printed circuit board is accommodated in a space formed by the first case, for example an upper case, and the second case, for example a lower case, and, at the same time, the printed circuit board is held and affixed by the holding and affixing member projecting from the inner surface of the upper case. When the printed circuit board is accommodated in the space formed by the upper case and the lower case and, at the same time, the printed circuit board is held and affixed by the holding and affixing member projected from the inner surface of the upper case, the printed circuit board is protected by the upper case, therefore a cover protecting only the printed circuit board becomes unnecessary. Accordingly, an electric circuit connection container having a reduced number of parts, facilitating part management, and, at the same time, cheaper in price can be obtained.

Further, the electric circuit connection container of the present invention is structured to enable several layers of printed circuit boards to be accommodated.

Further, the electric circuit connection container of the present invention is characterized in that the holding and affixing member is provided with a receiving rib to be engaging with the upper surface of the printed circuit board and a lock piece to be engaged with the lower surface of the printed circuit board. According to this structure, the holding and affixing of the printed circuit board can be easily and in addition reliably carried out.

BRIEF DESCRIPTION OF THE DRAWINGS

The above objects and features of the present invention and other objects and features will be more apparent from the following description of the preferred embodiments given with reference to the accompanying drawings, wherein.

DESCRIPTION OF THE PREFERRED EMBODIMENTS

Figure 1:
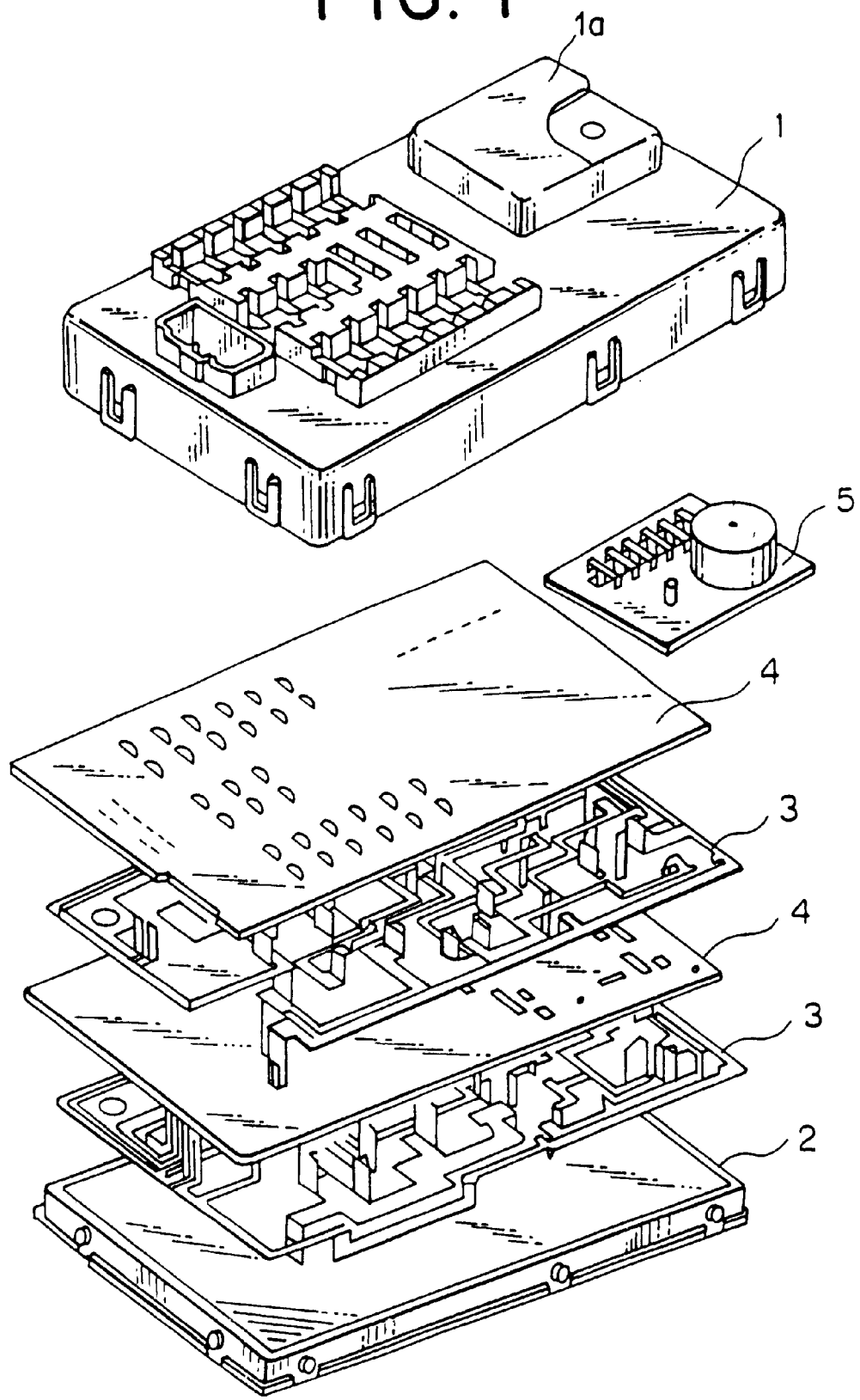
FIG. 1 is a perspective view of disassembled parts of an embodiment of an electric circuit connection container according to the present invention.

Below, an embodiment of the present invention will be explained by referring to the drawings.

FIG. 1 is a perspective view of disassembled parts of an electric circuit connection container according to an embodiment of the present invention.

The electric circuit connection container illustrated in FIG. 1 is structured to accommodate in a space formed by an upper case 1 and a lower case 2, busbars 3, 3 formed by punching a metal sheet, insulation plates 4, 4 carrying the busbars 3,3 for providing insulation with adjoining, and a printed circuit board 5 on which electronic components etc. are mounted. Further, while not shown, the electric circuit connection container of the present invention may in accordance with need carry a protective fuse, relays, etc. in the upper case 1 and the lower case 2.

As shown in the drawing, connectors for connecting the case with an external circuit are provided on the upper surface of the upper case 1. Via these connectors, connection with the electronic components and other electric circuits on the printed circuit board 5 is established inside the electric circuit connection container.

The upper case 1 and the lower case 2 are formed by extruded plastics.

Further, the number of layers of the busbars 3 and the insulation plates 4 is appropriately selected in accordance with the circuit situation.

Figure 2:
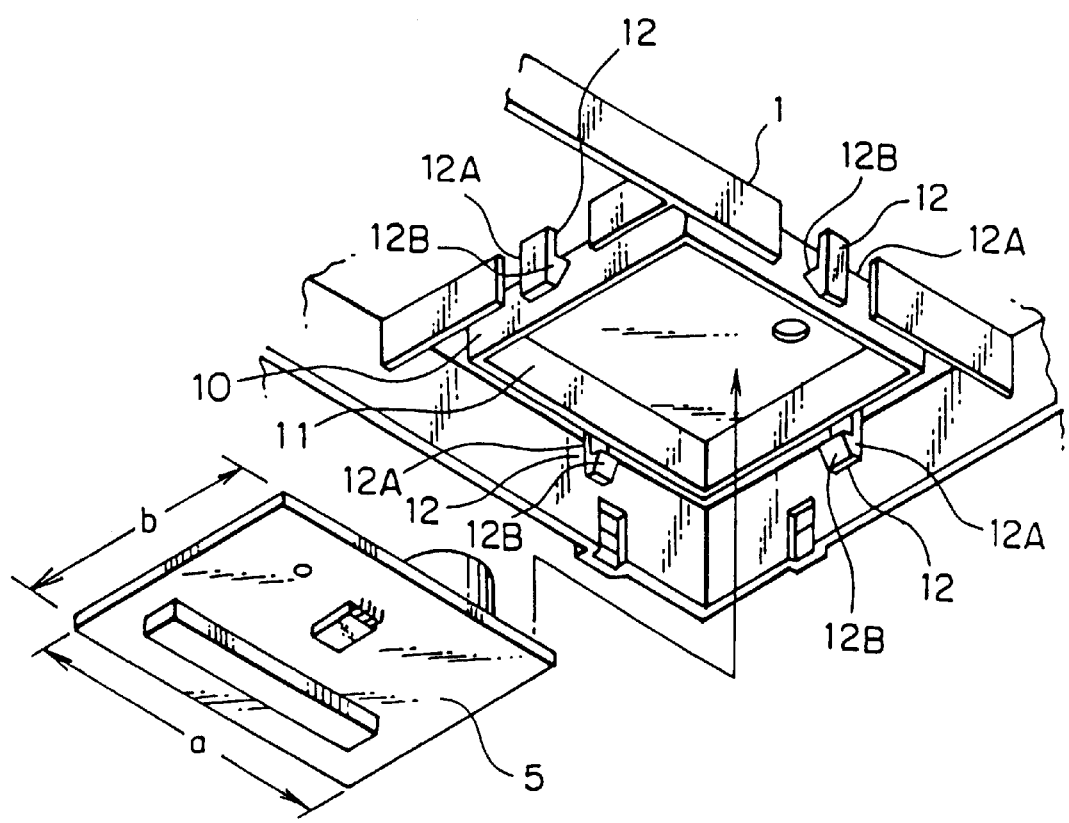
FIG. 2 is a bottom perspective view of the electric circuit connection container of the embodiment of the present invention illustrated in FIG. 1.

FIG. 2 is a bottom perspective view of principal parts of the electric circuit connection container of the embodiment of the present invention illustrated in FIG. 1. As illustrated in FIG. 1 and FIG. 2, the printed circuit board 5 is arranged at a position facing the inner surface (lower surface) of the upper case 1. Note that, on the printed circuit board 5, resistors, capacitors, buzzers, etc. are mounted. The buzzers, large size capacitors, etc. project from the plane of the printed circuit board 5, so some ingenuity becomes necessary to prevent the projecting portions from striking the upper case when they are accommodated in the upper case 1.

Figure 3:
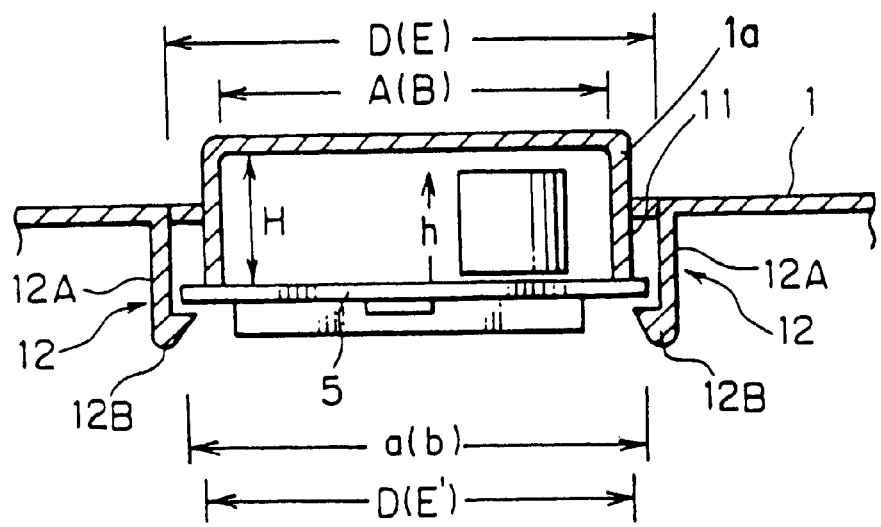
FIG. 3 is a view of a state where a printed circuit board is temporarily held by a holding and affixing member in the electric circuit connection container of the embodiment of the present invention.

FIG. 3 is a view of the state where the printed circuit board is temporarily held by the holding and affixing member in the electric circuit connection container of the embodiment of the present invention.

As shown in FIG. 2 and FIG. 3, at the inner surface (lower surface) of the upper case 1, a holding and affixing member 10 for holding and affixing the printed circuit board 5 is projected. This holding and affixing member 10 is provided with a receiving rib 11 to be engaged with a circumferential edge of the upper surface of the printed circuit board 5 and lock pieces (claws) 12 to be engaged with the lower surface of the printed circuit board 5.

The receiving rib 11 is formed as a square. The widths A and B thereof are slightly smaller than widths a and b of the printed circuit board 5. The circumferential edge of the upper surface of the printed circuit board 5 is supported by the receiving rib 11, thereby preventing the printed circuit board 5 from entering into the internal portion of the holding and affixing member 10. Further, a projection height H of the receiving rib 11 is set so that the parts placed on the printed circuit board 5 do not contact the inner surface of a projection 1a formed in the upper case 1 when the front end of the receiving rib 11 is engaged with the circumferential edge of the upper surface of the printed circuit board 5. In other words, the projection height H of the receiving rib 11 is set higher than the height h of the highest part among the electronic components or electric parts mounted on the printed circuit board 5.

The material of the receiving rib 11 is desirably an insulating material, for example a plastic, from the viewpoint of preventing a short circuit with the electronic components etc. mounted on the printed circuit board 5. Further, preferably, the holding and affixing member 10 having the receiving rib 11 can be integrally formed with the upper case 1 as a part of the upper case 1. If this is done, the manufacturing of the holding and affixing member 10 becomes easy, the assembly work into the upper case 1 becomes unnecessary, and in addition the price is further lowered.

Four lock pieces 12 are formed projected from the inner surface of the upper case 1 so as to be engaged with the lower surface of the four sides of the printed circuit board 5, in other words, so as to support the lower surface of the printed circuit board 5 with its circumferential edges engaged with the receiving rib 11 and prevent the printed circuit board 5 from being separated from the receiving rib 11. Each of the lock pieces 12 is constituted by a projection portion 12A and an L-shaped engaging portion 12B formed at the front end of the projection portion 12A. The distances D and E between the projection portions 12A and 12A of facing lock pieces 12 and 12 are made slightly larger than the widths a and b of the printed circuit board 5 so as to be able to receive and affix the printed circuit board 5. The L-shaped engaging portion 12B is engaged with the lower surface of the printed circuit board 5.

The L-shaped engaging portion 12B (claw) is projected from the front end of the lock piece 12 and is designed to prevent the printed circuit board 5 engaged with the receiving rib 11 from disengaging. The distances D' and E' of the L-shaped engaging portions 12B and 12B of the facing lock pieces 12 are smaller than the widths a and b of the printed circuit board 5. However, each of the lock pieces 12 has resiliency and can open outward to allow the printed circuit board 5 to therethrough when the printed circuit board 5 is being engaged with the lock piece 12.

The lock piece 12 is desirably integrally formed with the upper case 1 in the same way as the receiving rib 11. In this case, the lock piece 12 is formed by a plastic to ensure insulation with respect to the printed circuit board 5. Of course, it is also possible to constitute the lock piece 12 by a thin metal sheet having resiliency, for example, a steel sheet.

Preferably, the holding and affixing member 10 having the receiving rib 11 and the lock pieces 12 is integrally formed with the upper case 1.

METHOD OF ASSEMBLY

Below, a description will be made of the temporary holding (temporary affixing) of the printed circuit board 5.

In order have the printed circuit board 5 held to and affixed by the holding and affixing member 10 having the above structure, as shown in FIG. 2 and FIG. 3, the L-shaped engaging portion (claw) 12B of the lock piece 12 is pushed open by for example the hand and the printed circuit board 5 is inserted toward the receiving rib 11, then L-shaped engaging portion 12B is released to allow it to return to its original state so that the lower surface of the printed circuit board 5 is engaged by the L-shaped engaging portions 12B and the printed circuit board 5 is held between the receiving rib 11 and the L-shaped engaging portions 12B of the lock pieces 12. In such a state, the printed circuit board 5 is loosely held between the receiving rib 11 and the L-shaped engaging portions 12B of the lock pieces 12 and is therefore in the temporarily affixed state.

Below, a description will be made of the final affixing of the printed circuit board 5.

Figure 4:
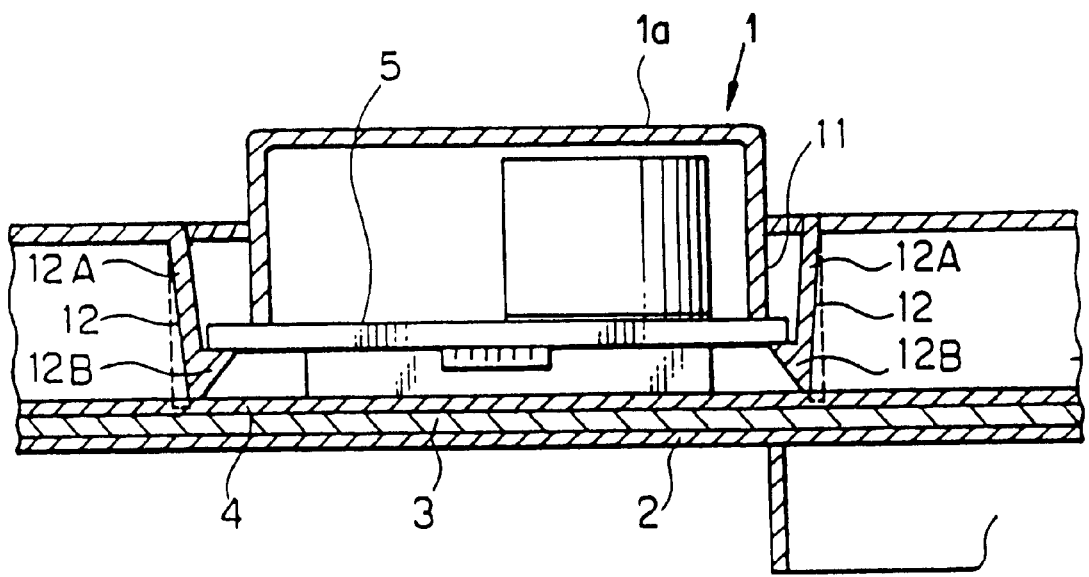
FIG. 4 is an explanatory view of the state where the printed circuit board is held and affixed by the holding and affixing member.

The temporarily affixed printed circuit board 5 is held and affixed in the final affixed state in the upper case 1 and the lower case 2. As shown in FIG. 4, when the busbars 3 formed by punching a metal sheet and the insulation plates 4 on which the bus-bars 3 are placed are accommodated superposed in the space formed in the upper case 1 and the lower case 2 and the upper case 1 and the lower case 2 are affixed in such a state, the lock pieces 12 are deformed from the dotted line position to the full line position by being pressed against the insulation plates 4. By this, the printed circuit board 5 is strongly held and affixed in the final affixed state between the receiving rib 11 and the L-shaped engaging portions 12B of the lock pieces 12. In this way, the printed circuit board 5 strongly held and affixed between the receiving rib 11 and the L-shaped engaging portions 12B of the lock pieces 12 will not move by vibration etc.

As described above, the electric circuit connection container of the embodiment of the present invention is structured to accommodate a printed circuit board 5 on which are mounted electronic components etc. projecting out into the space formed by the upper case 1 and the lower case 2 and, at the same time, hold and affix the printed circuit board 5 by the holding and affixing member 10 projecting out from the inner surface of the upper case 1, therefore a cover for protecting only the printed circuit board 5 as in the method of the related art becomes unnecessary. As a result, an electric circuit connection container having a reduced number of parts, facilitating part management and, at the same time, cheaper in price can be obtained. Particularly, when the holding and affixing member 10 comprising the receiving rib 11 and the lock pieces 12 is integrally constituted with the upper case 1 and manufactured simultaneously with the upper case 1, the manufacturing and assembly work consists merely of fabrication of the upper case 1, so the fabrication and assembly work of the holding and affixing member 10 become unnecessary. Also, the price becomes very cheap.

Further, when the electric circuit connection container is constituted so as to hold and affix the printed circuit board by using the holding and affixing member provided with the receiving rib for engagement with the upper surface of the printed circuit board and the lock pieces for engagement with the lower surface of the printed circuit board, the printed circuit board can be easily and in addition reliably held and affixed.

Further, the electric circuit connection container of the present embodiment can be structured to hold several layers of printed circuit boards as illustrated.

In this way, according to the embodiment of the present invention, the assembly of the electric circuit connection container is reliable and easy.

Further, if the printed circuit board is held and affixed in the case in advance, when fabricating the electric circuit connection container, the electronic components will be protected by the case and not damaged.

Note that, in the above embodiment, the receiving rib 11 was formed square, but it is sufficient in so far as the receiving rib 11 can stably engage with the printed circuit board 5. The shape of the receiving rib 11 may be for example a rod-like projection piece. The shape is not particularly limited.

Further, the shape and number of the lock pieces 12 are not particularly limited. For example, the L-shaped engaging portion can be replaced by a key type engaging portion.

Note that, in the above embodiments, examples of providing the holding and affixing member 10 on the inner surface (lower surface) of the upper case 1 were shown, but it is sufficient so far as the holding and affixing member 10 is provided at the part to which the projected parts of the printed circuit board 5 face. For example, where the parts of the printed circuit board 5 are located at the lower case 2 side, the holding and affixing member 10 may be provided on the inner surface of the lower case 2. Accordingly, the example of providing the holding and affixing member 10 on the inner surface of the upper case 1 is merely an example.

The electric circuit connection container according to the present invention is structured to accommodate a printed circuit board on which are mounted parts projecting out into the space formed by a first case, for example, the upper case 1, and a second case, for example, the lower case 2, and, at the same time, to hold and affix the printed circuit board by a holding and affixing member projecting out from the inner surface of the upper case, therefore a cover protecting only the printed circuit board becomes unnecessary. Accordingly, an electric circuit connection container having a reduced number of parts, facilitating part management and, at the same time, cheaper in price can be obtained.

Further, the electric circuit connection container of the present invention may be structured to accommodate several printed circuit boards.

Further, when the electric circuit connection container is constituted so as to hold and affix a printed circuit board by using a holding and affixing member provided with a receiving rib for engagement with the upper surface of the printed circuit board and lock pieces for engagement with the lower surface of the printed circuit board, the printed circuit board can be easily and in addition reliably held and affixed. Further, if the printed circuit board is held and affixed in the case in advance, at the fabrication of the electric circuit connection container, the electronic components are protected by the case and not damaged.

According to the method of assembly of the electric circuit connection container of the present invention, the electric circuit connection container can be assembled reliably or in a short time.

While the invention has been described by reference to specific embodiments chosen for purposes of illustration, it should be apparent that numerous modifications could be made thereto by those skilled in the art without departing from the basic concept and scope of the invention.

What is claimed is:

1. A method for assembling an electric circuit connection container having a first case, a second case which faces the first case to define a space with said first case in which space a printed circuit board is accommodated, and a holding and affixing member comprising a receiving rib extending from an inner face of said first case for engagement with an upper surface of said printed circuit board and a lock piece extending from an inner face of said first case for engagement with a lower surface of the printed circuit board by affixing said printed circuit board to the electric circuit connecting container, said method comprising:

forming said receiving rib as an outline of a square with both transverse dimensions slightly smaller than the corresponding widths of the printed circuit board, a lateral extent of the receiving rib being smaller than the lateral extent of the printed circuit board pushing open said lock piece and making said printed circuit board abut against the upper edge of said receiving rib;

returning said lock piece to its original position to affix said printed circuit board by the lock piece; and pressing against said first case and said second case to finally affix said printed circuit board and to press said lock piece towards its circuit board affixing position.

2. An electric circuit connection container comprising:
a first case;
a second case facing said first case, and defining a space with said first case, said space accommodating a printed circuit board;
a receiving rib stopping said printed circuit board in a state where an electric part mounted on said printed circuit board is accommodated in said receiving rib, and fixed in a direction perpendicular to a surface of said first case; and
a lock piece extended from inner plane of said first case and attachably and detachably fixing an end of said printed circuit board stopped by said receiving rib.

3. An electric circuit connection container according to claim 2, wherein said receiving rib is integrally formed with said first case.

4. An electric circuit connection container according to claim 2, wherein said lock piece is integrally constituted with said first case.

5. An electric circuit connection container
a first case;
a second case which faces the first case to define, a space with said first space in which space a printed circuit board is accommodated; and
a holding and affixing member having a part projected from an inner surface of said first case, engaging with said printed circuit board, and affixing the engaged printed circuit board wherein said member comprises a receiving rib formed as an outline of a square with dimensions slightly smaller than the widths of the printed circuit board and engaged with an upper surface of the printed circuit board, a lateral extent of the receiving rib being smaller than the lateral extent of the printed circuit board, and a lock piece engaged with a lower surface of the printed board.

6. An electric circuit connection container according to claim 5, wherein the holding and affixing member having said receiving rib and said lock piece is integrally formed with said first case.

7. An electric circuit connection container according to claim 5, wherein said first case is formed by an insulating resin.

8. An electric circuit connection container according to claim 5, wherein, in addition to said printed circuit board, a bus bar and an insulation plate are arranged between said first case and said second case.

9. An electric circuit connection container according to claim 5, wherein a connector for connection with an external portion is provided on an outer surface of said first case.

10. An electric circuit connection container according to claim 5, wherein said first case is an upper case, and said second case is a lower case.

* * * * *

UNITED STATES PATENT AND TRADEMARK OFFICE
CERTIFICATE OF CORRECTION

PATENT NO. : 6,217,377 B1
DATED : April 17, 2001
INVENTOR(S) : Nishizawa

It is certified that error appears in the above-identified patent and that said Letters Patent is hereby corrected as shown below:

Title page,
Item [54], please change "Electric Circuit Connection Container" to -- ELECTRIC CIRCUIT CONNECTION CONTAINER WITH SUPPORT FOR PRINTED CIRCUIT BOARD --.

Signed and Sealed this

Twenty-second Day of January, 2002

*Attest:*

JAMES E. ROGAN
*Attesting Officer*  *Director of the United States Patent and Trademark Office*